(12) United States Patent
Ng

(10) Patent No.: US 12,136,583 B2
(45) Date of Patent: Nov. 5, 2024

(54) METHOD OF FORMING A CHIP PACKAGE, METHOD OF FORMING A SEMICONDUCTOR ARRANGEMENT, CHIP PACKAGE, AND SEMICONDUCTOR ARRANGEMENT

(71) Applicant: Infineon Technologies AG, Neubiberg (DE)

(72) Inventor: Chee Yang Ng, Muar (MY)

(73) Assignee: Infineon Technologies AG, Neubiberg (DE)

( * ) Notice: Subject to any disclaimer, the term of this patent is extended or adjusted under 35 U.S.C. 154(b) by 82 days.

(21) Appl. No.: 17/519,805

(22) Filed: Nov. 5, 2021

(65) Prior Publication Data

US 2022/0139798 A1 May 5, 2022

(30) Foreign Application Priority Data

Nov. 5, 2020 (DE) .......................... 102020129148.5

(51) Int. Cl.
| | | |
|---|---|---|
| *H01L 23/34* | (2006.01) | |
| *H01L 21/56* | (2006.01) | |
| *H01L 23/31* | (2006.01) | |
| *H01L 23/367* | (2006.01) | |
| *H01L 23/373* | (2006.01) | |
| *H01L 23/433* | (2006.01) | |

(52) U.S. Cl.
CPC .......... *H01L 23/373* (2013.01); *H01L 21/565* (2013.01); *H01L 23/3107* (2013.01); *H01L 23/3672* (2013.01); *H01L 23/4334* (2013.01)

(58) Field of Classification Search
CPC . H01L 23/373; H01L 21/565; H01L 23/3107; H01L 23/3672; H01L 23/4334
USPC ......................................................... 257/723
See application file for complete search history.

(56) References Cited

U.S. PATENT DOCUMENTS

| | | | |
|---|---|---|---|
| 2013/0241044 A1* | 9/2013 | Kim | H01L 23/4334 |
| | | | 257/E23.18 |
| 2014/0239479 A1 | 8/2014 | Start | |
| 2015/0102474 A1 | 4/2015 | Kimura | |
| 2017/0098598 A1* | 4/2017 | Otremba | H01L 23/4006 |
| 2019/0164859 A1 | 5/2019 | Chen et al. | |
| 2020/0381335 A1 | 12/2020 | Takatsu | |

FOREIGN PATENT DOCUMENTS

| | | | |
|---|---|---|---|
| DE | 102019122382 B3 | | 9/2020 |
| EP | 3 518 312 | * | 7/2019 |
| WO | 2019082333 A1 | | 5/2019 |

* cited by examiner

*Primary Examiner* — Caleb E Henry
*Assistant Examiner* — Dilinh P Nguyen
(74) *Attorney, Agent, or Firm* — Murphy, Bilak & Homiller, PLLC

(57) ABSTRACT

A method of forming a chip package is provided. The method may include: arranging an elastic thermal interface material over a semiconductor chip, wherein the elastic thermal interface material may be configured to transfer heat from the chip to an outside; arranging a mold around the thermal interface material and at least partially around the semiconductor chip, thereby compressing the elastic thermal interface material with the mold; and filling the mold with a packaging material.

9 Claims, 13 Drawing Sheets

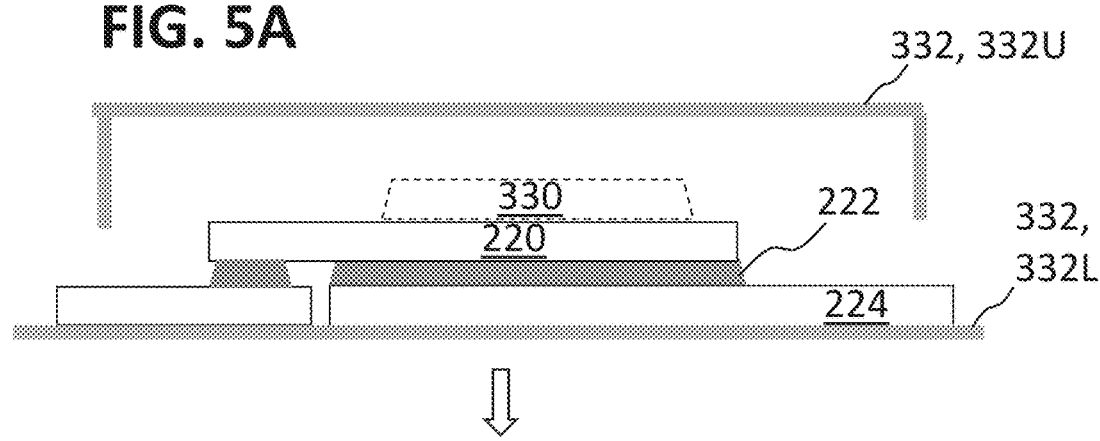
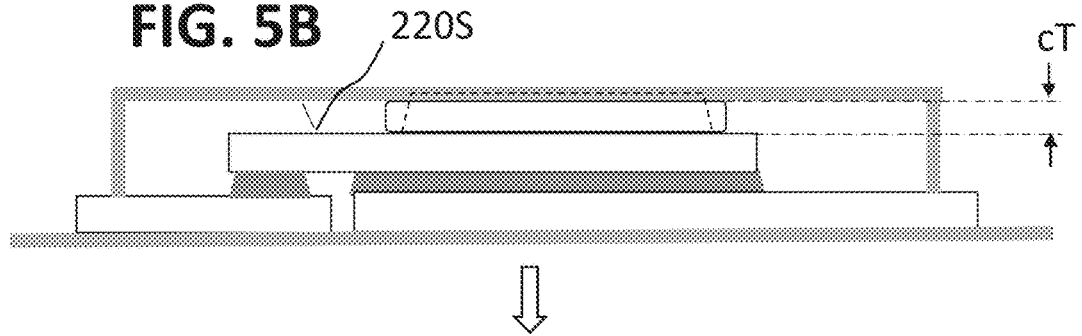
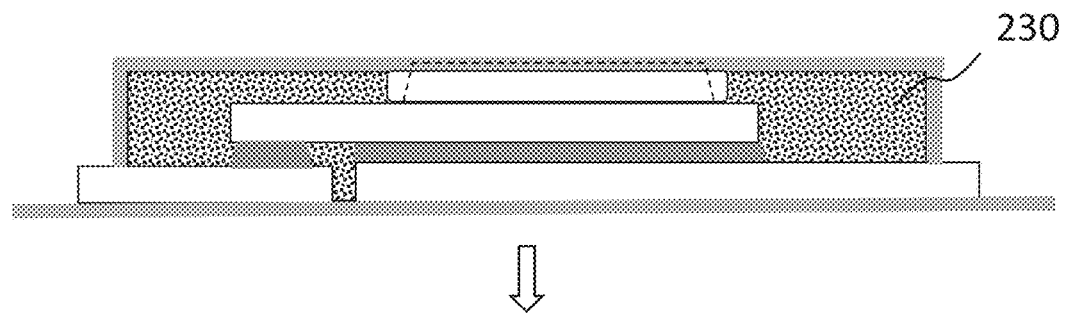
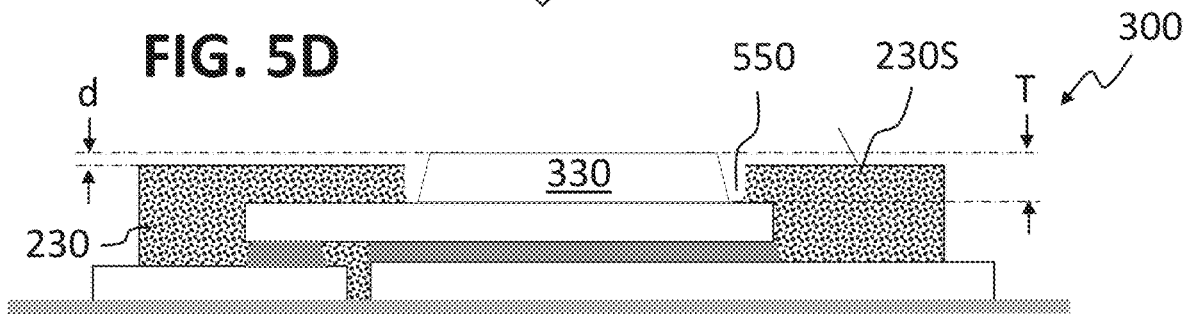

FIG. 10A
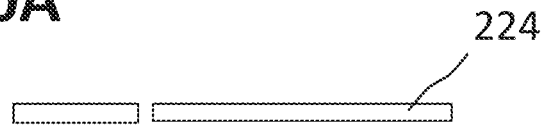
FIG. 10B
FIG. 10C
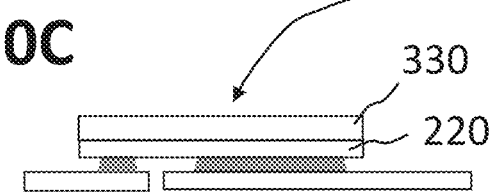
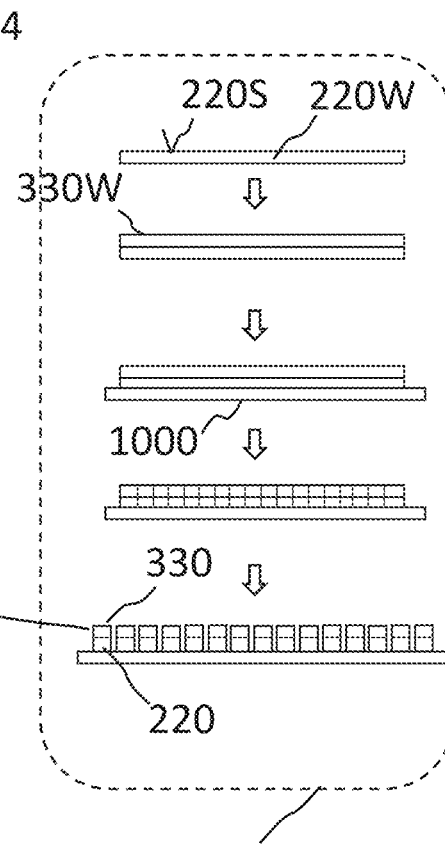
FIG. 10S
FIG. 10D
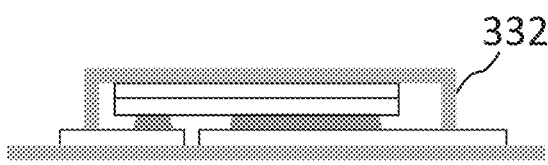
FIG. 10E
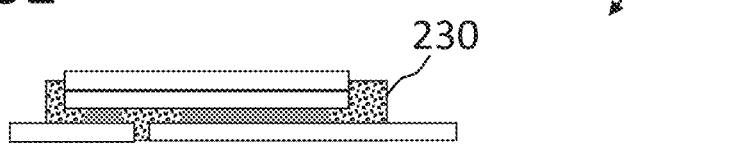

METHOD OF FORMING A CHIP PACKAGE, METHOD OF FORMING A SEMICONDUCTOR ARRANGEMENT, CHIP PACKAGE, AND SEMICONDUCTOR ARRANGEMENT

TECHNICAL FIELD

Various embodiments relate generally to a method of forming a chip package, a method of forming a semiconductor arrangement, a chip package and a semiconductor arrangement.

BACKGROUND

Chips in chip packages typically generate such a high amount of heat that a cooling structure of concept may be required for removing the heat from the package in order to avoid damage to the package. Attaching a cooling structure on one side of the package has been practiced in the art for many years.

An example of a chip package 200 in accordance with a state of the art is shown in FIG. 2. The chip 220 may be mounted to a leadframe 224 by a mounting material 222, and to a clip 228 by another mounting material 226. A packaging material 230 may be formed to enclose the chip 220, the leadframe 224, and partially the clip 228. A main surface of the clip 228 may be exposed by the packaging material 230.

A thermal interface material 234 may be formed on the exposed surface of the clip 228, and a cooling structure 236 may be attached to the thermal interface material.

In this arrangement, heat may mainly be dissipated from the chip 220 through the mounting material 226, the clip 228, the thermal interface material 234 and the cooling structure 236 (see the arrow in FIG. 2). Typically, the cooling structure 236 may be mounted to an exposed heat transmitting surface, for example the exposed clip 228 (in FIG. 2 exposed at the package 200 top side) at a customer's side.

More recently, so-called Dual Side Cooling (DSC), which uses both main surfaces of a chip package 200 for cooling, has become more and more common to enhance package thermal dissipation.

However, to enable DSC may cause increased manufacturing costs for the chip package, at least for the reasons described below. Even though the reasoning below may routinely apply to chip packages with dual side cooling, a similar reasoning may generally apply (e.g., also for packages 200 with single side cooling) when a cooling surface (e.g., a clip 228) on the one hand is to be partially enclosed in but on the other hand is also to be exposed by the packaging material 230.

Such a chip package 200 may generally be formed using one of two processes.

A first process, also referred to as film assist molding (FAM) may use a so-called molding film. The surface to be exposed in the finished chip package 200, for example a main surface of the clip 228 or a surface of the chip 220 itself, may be attached to the molding film before the molding process. After the packaging material 230 is arranged and cured, the molding film may be removed.

Increased costs may be generated by a specific mold machine suitable for film assist molding and by the film.

Furthermore, a packaging result may be suboptimal, because packaging material 230 creeping between the film and the surface to be exposed (referred to as "mold flashes" often occurs. It may either be left in place, where it may reduce heat dissipation, or it may be removed, which causes additional costs.

A reason for the packaging material 230 on the exposed surface may be levelling difficulties, which may be more challenging for the clip 228 with its additional degrees of freedom (as compared with a chip 220 surface).

On the other hand, to expose the chip 220 itself using the film may involve an additional risk of mechanical damage to the chip 220.

A second process to expose the clip 230 or the chip 220 may involve package 200 grinding.

An advantage over the FAM may be that a normal mold machine may be used.

However, package grinding is known to be an expensive process, with the grind wheel wear and tear generating most of the costs.

However, an additional risk to chip 220 (or to a structure of the package 200 in general) may be introduced by mechanical stress.

SUMMARY

A method of forming a chip package is provided. The method may include arranging an elastic thermal interface material over a semiconductor chip, wherein the elastic thermal interface material may be configured to transfer heat from the chip to an outside, arranging a mold around the thermal interface material and at least partially around the semiconductor chip, thereby compressing the elastic thermal interface material with the mold, and filling the mold with a packaging material.

The elastic thermal interface material may bear against the mold to form a seal that prevents the packaging material from seeping through or into an interface between the elastic thermal interface material and the mold.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 5A to 5D illustrate in detail, as a sequence of schematic cross-sectional views, several processes of a method of forming a chip package according to various embodiments;

Figure 7A:
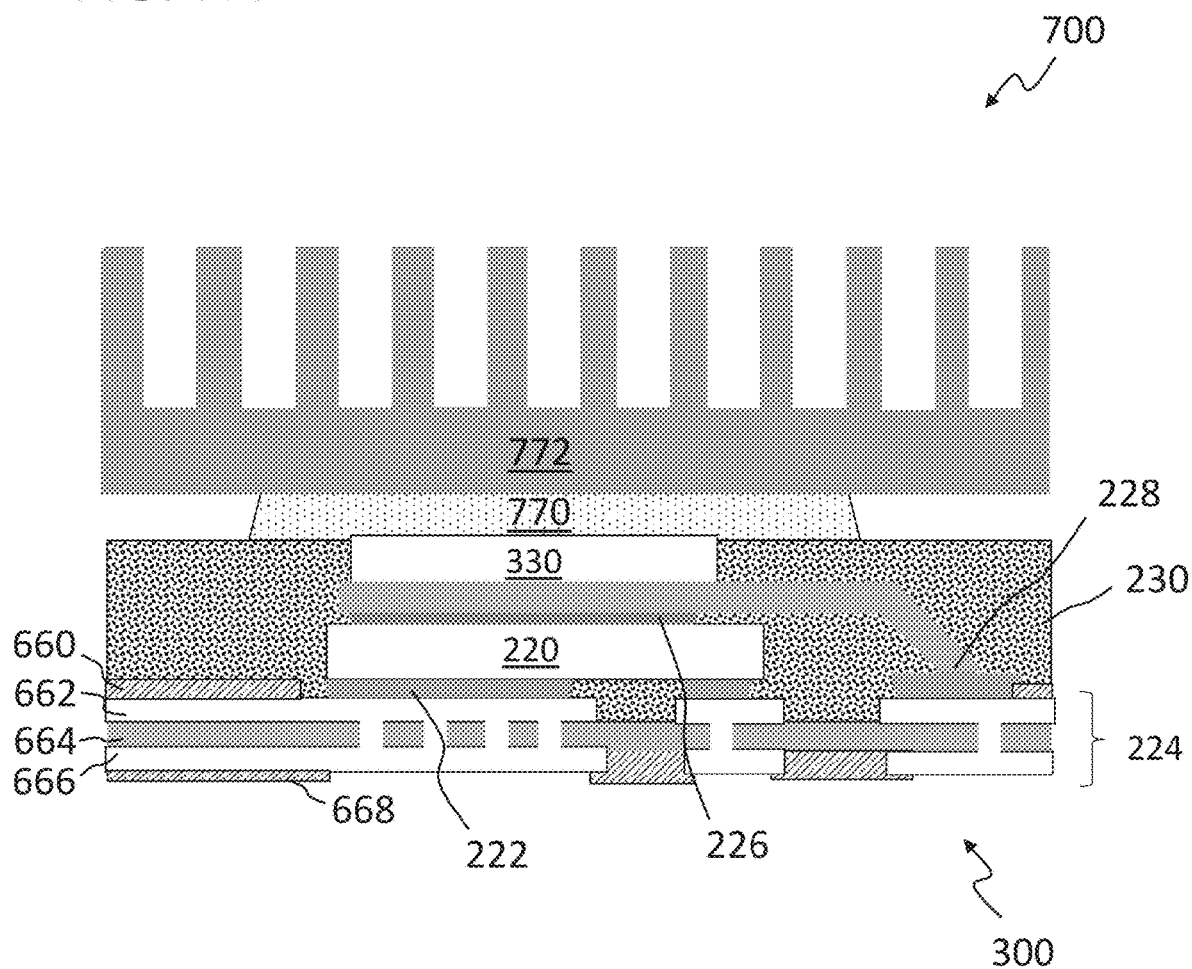
Figure 7B:
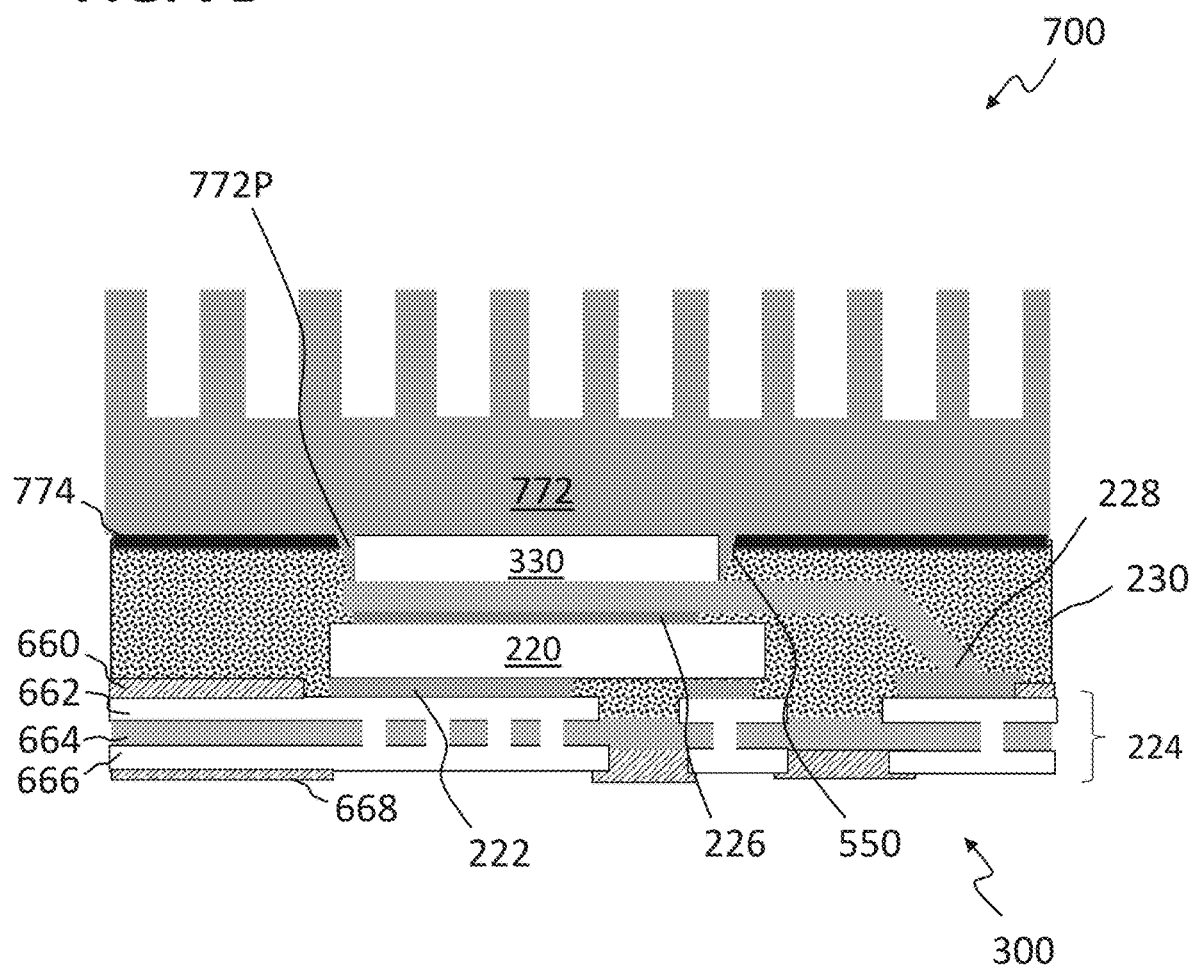
Figure 8:
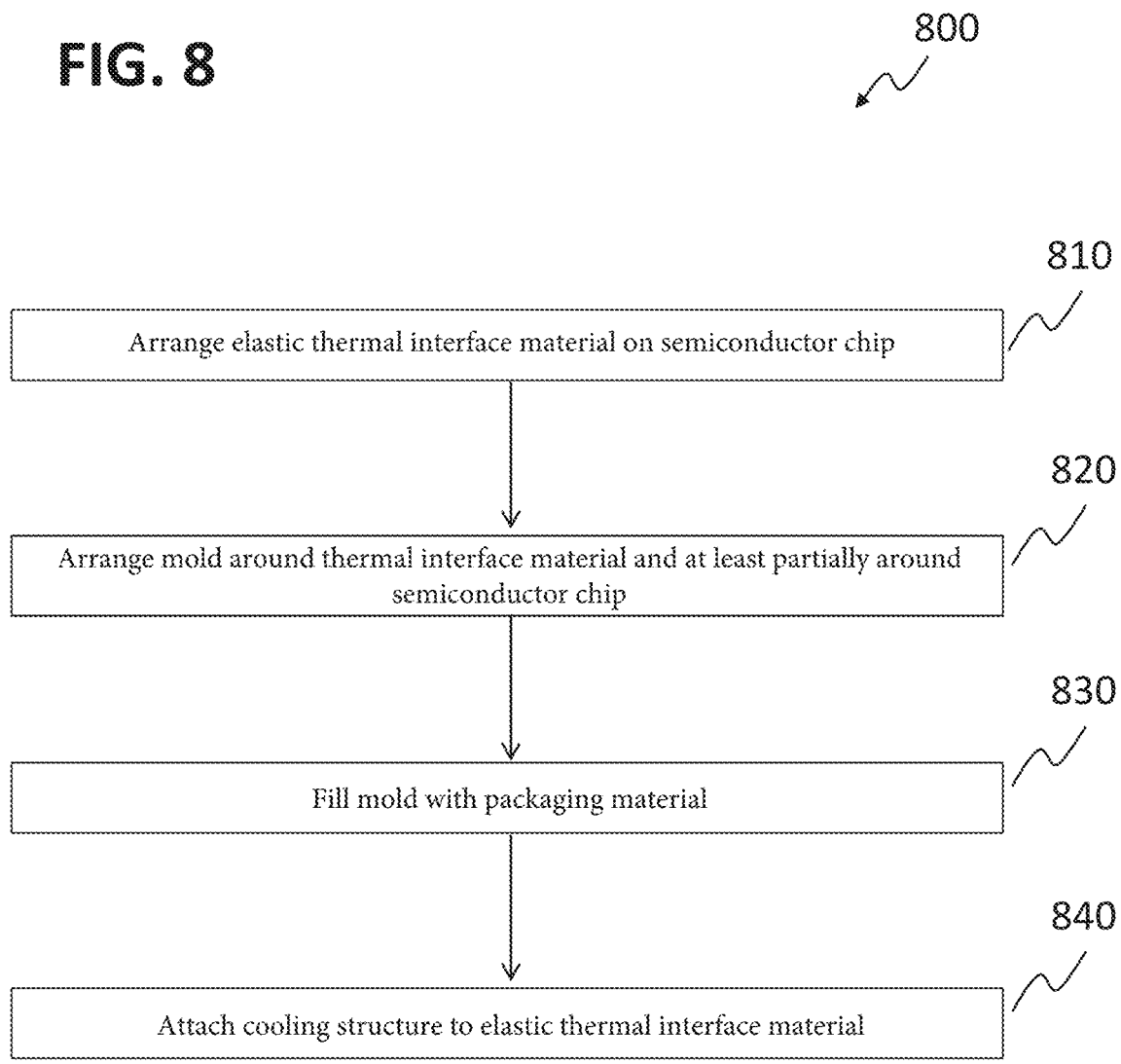
Figure 9:
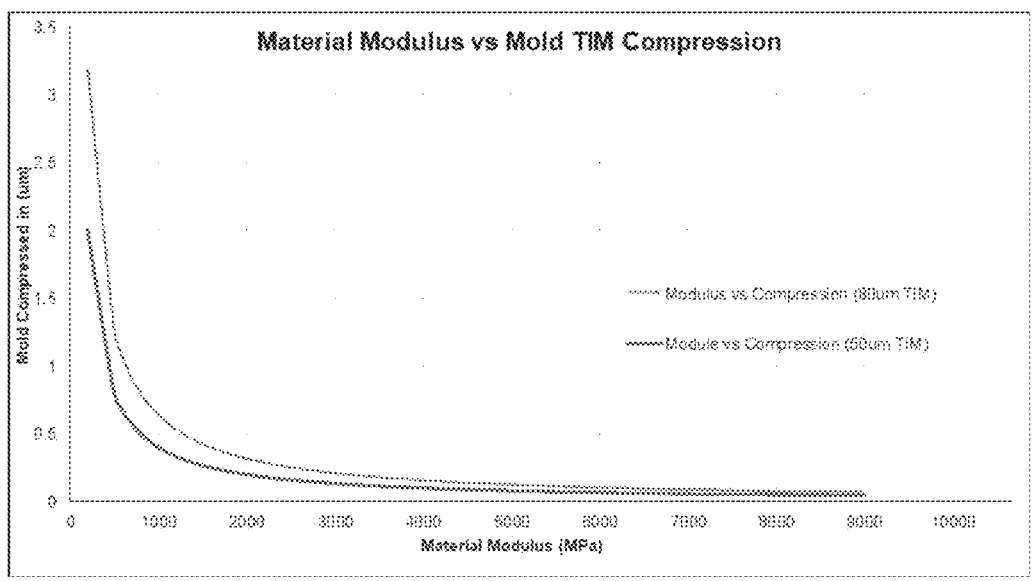

each of FIGS. 6A to 6E shows a schematic cross-sectional view of a chip package in accordance with various embodiments.

each of FIGS. 7A and 7B shows a schematic cross-sectional view of a semiconductor arrangement in accordance with various embodiments;

FIG. 8 shows a flow diagram of a method of forming a semiconductor arrangement;

FIG. 9 shows a diagram of compression versus Young's modulus for thermal interface materials in accordance with various embodiments;

FIGS. 10A to 10E (including the side process shown in FIG. 10S) illustrate, as a sequence of schematic cross-sectional views, a method of forming a chip package according to various embodiments

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of the disclosure are provided for devices, and various aspects of the disclosure are provided for methods. It will be understood that basic properties of the devices also hold for the methods and vice versa. Therefore, for sake of brevity, duplicate description of such properties may have been omitted.

In various embodiments, a package may be provided that may include the thermal interface material as part of the package. The thermal interface material may directly contact a chip included in the chip package and may be exposed at a surface, e.g. a main surface, of the package.

Alternatively, the thermal interface material may indirectly contact the chip, for example by being formed on a clip that may be in direct or at least thermal contact with the chip.

A cooling structure may in various embodiments be mounted to the thermal interface material, for example by a customer.

The thermal interface material may be compressible, for example elastic. The thermal interface material may for example have soft/spongy physical properties, at least at a processing temperature when a packaging material is arranged around the chip.

In various embodiments, before the packaging material is applied, a mold may be arranged around the chip arrangement to be encapsulated by the packaging material in such a way that the compressible thermal interface material is compressed. The thermal interface material may act as a stopper for the packaging material.

In other words, the thermal interface material that is compressible and pressed against the mold (e.g., an inner surface of the mold) when the liquid packaging material is arranged in the mold may prevent the packaging material from flowing into a space between the thermal interface material and the mold. Thereby, the packaging material may be prevented from settling on the thermal interface material, thereby increasing a thermal performance.

By ensuring, using the above described processes, that the thermal interface material is exposed at an outer surface of the package when the mold is removed, the package with the exposed thermal interface material may in various embodiments be provided without grinding and without having to use a film.

In addition, the thermal interface material protruding above the surface of packaging material may in various embodiments facilitate an easy attachment of an external heat sink.

The thermal interface material may re-expand after a removal of the mold.

The thermal interface material that is part of the chip package may further enhance a conformity of package and cooling structure (also referred to as heatsink).

In various embodiments, a customer may be able to use a thinner (further) thermal interface material for mounting the cooling structure, whereby a heat performance may be enhanced.

Furthermore, the chip may in various embodiments be protected from mechanical damage during the packaging, because the thermal interface material that may be pressed onto the chip may be compressible/elastic.

FIGS. 3A to 3F, FIGS. 4A to 4H, and FIGS. 10A to 10E (with the side process shown in FIG. 10S) respectively illustrate, as a sequence of schematic cross-sectional views, a method of forming a chip package 300 according to various embodiments. FIGS. 5A to 5D illustrate in detail, as a sequence of schematic cross-sectional views, several processes of a method of forming a chip package 300 according to various embodiments. And each of FIGS. 6A to 6E shows a schematic cross-sectional view of a chip package 300 in accordance with various embodiments.

In various embodiments, a method of forming a chip package and a resulting chip package 300 are provided.

The method may include mounting a semiconductor chip 220 (chip 220 for short) on a carrier 224 using an adhesion material 222. Exemplary embodiments of the mounting process are shown in FIGS. 3A to 3C and 5A to 5C.

The semiconductor chip 220 may include or consist of any kind of semiconductor chip 220, for example a transistor chip or the like, in particular a semiconductor chip 220 that benefits from high thermal performance like a power chip, for example a power transistor.

The carrier 224 may be configured to provide mechanical support for the chip 220. In various embodiments, the carrier 224 may further be configured to provide electrically conductive connections, for example contact pads for the chip package 300, in which case the adhesion material 222 may be electrically conductive, for example a soldering material, an electrically conductive glue, or the like, and/or a thermal interface, in which case the adhesion material may be electrically conductive or insulating, but thermally conductive.

The adhesion material 222 may for example be applied using printing, e.g. stencil printing, or any other suitable process, for example as known in the art, and the chip bonding process may for example include a reflow process, a curing process, or any other suitable process, for example as known in the art.

The carrier 224 providing the electrically conductive connections may for example be or include a leadframe (like in the exemplary embodiments shown in FIGS. 3A to 3F, FIGS. 4A to 4H, FIGS. 5A to 5D, FIGS. 10A to 10E, FIG.

Figure 6A:
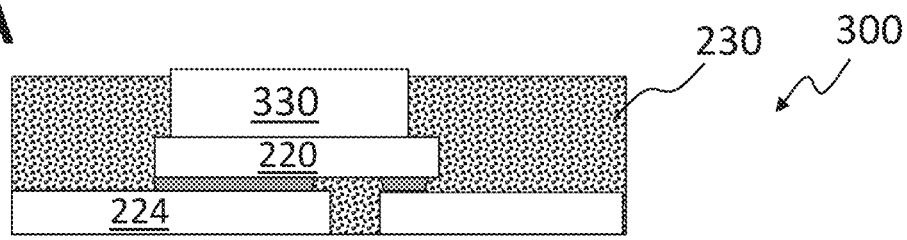
Figure 6B:
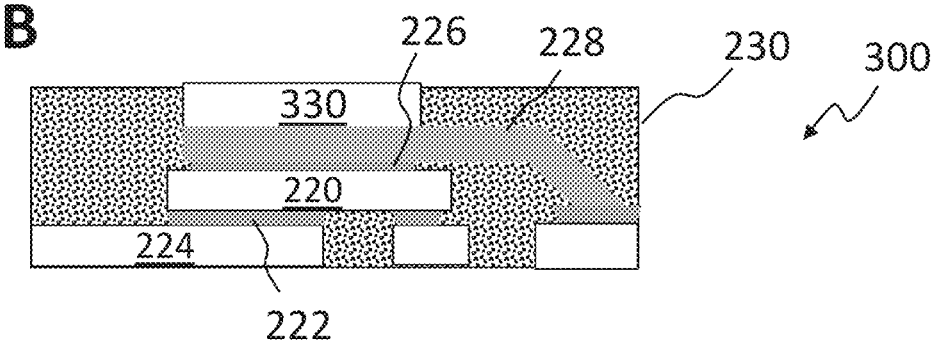
Figure 6C:
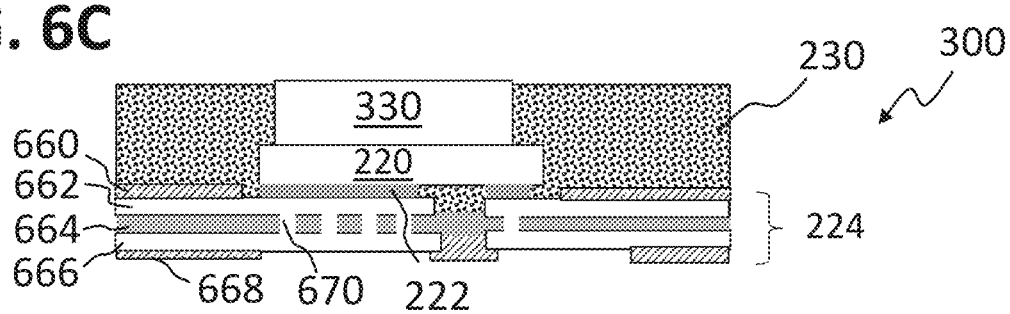
Figure 6D:
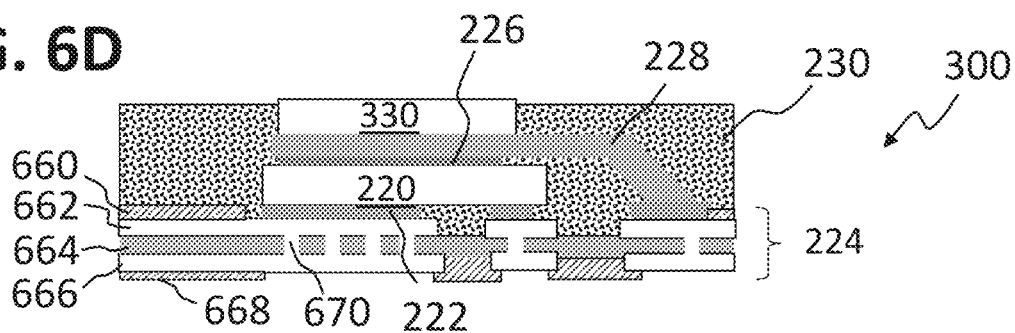
Figure 6E:
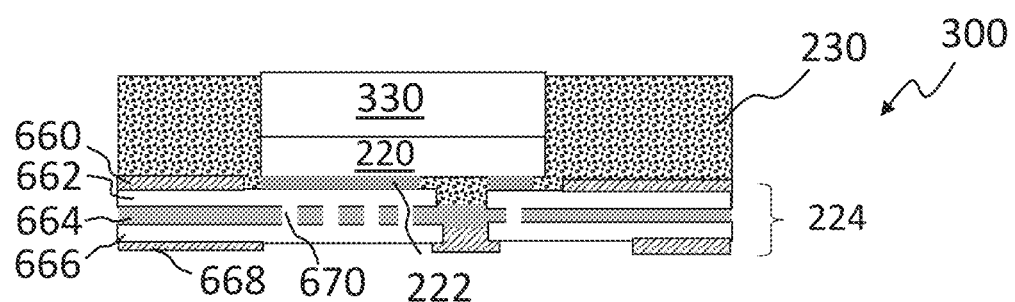

6A or FIG. 6B, a printed circuit board like in the exemplary embodiments of FIG. 6A, 6D or 6E, or the like.

Figure 3A:
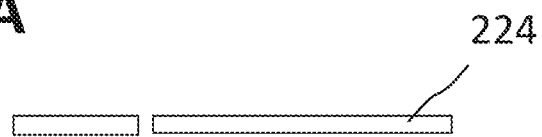
FIGS. 3A to 3F illustrate, as a sequence of schematic cross-sectional views, a method of forming a chip package according to various embodiments.
Figure 3B:
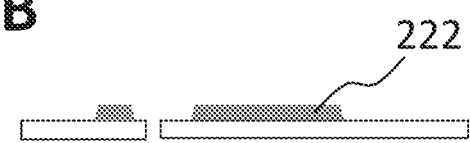
Figure 3C:
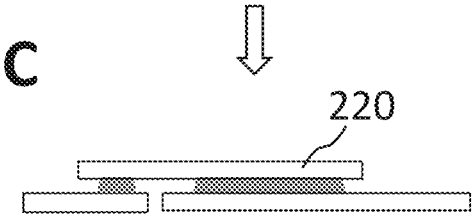
Figure 3D:
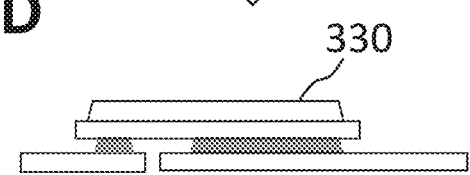

The method may include arranging an elastic thermal interface material 330 on the semiconductor chip 220. Exemplary embodiments of this process are shown in FIG. 3D, where the thermal interface material 330 is applied in direct physical contact with the chip 220, and in FIG. 4D, where a clip 228 (or a similar thermally conductive structure) is mounted (using a further adhesion material 226) in contact with the chip 220, and the thermal interface material 330 is applied in indirect contact with the chip 220, for example in direct physical contact with the clip 228.

The elastic thermal interface material 330 may for example be applied as a pre-defined pattern of the elastic thermal interface material 330, for example by using printing, e.g. stencil printing, or any other suitable process, for example as known in the art.

In various embodiments, for example as shown in FIG. 6E and visualized in FIG. 10A to 10E (including the side process shown in FIG. 10S) as a method of forming a chip package, the elastic thermal interface material 330 may in various embodiments be arranged to completely cover a top surface 220S of the chip 220, for example the chip 220 backside, which may be arranged at the top in a flip-chip configuration.

The method of forming the chip package may be similar to the method of FIG. 3A to FIG. 3F, except for the thermal interface material 330 being arranged together with the chip 220, for example in a pick-and-place-process.

The chip 220 with the thermal interface material 330 arranged thereon may be prepared by a method indicated as the side process shown in FIG. 10S. A layer of thermal interface material 330W may be arranged on a wafer 220W, for example covering a whole surface of the wafer 220W. In one embodiment, the layer of thermal interface material 330W is applied on the chip (for instance as a paste) and subsequently cured so that it adheres to the surface of the wafer 220W. In some instances, the curing process may result in a hardening of the thermal interface material 330W. Accordingly, the selected thermal interface material 330W should have sufficient elasticity post-cure such that it can prevent the ingress of packaging material through an interface between the elastic thermal interface material and the mold during the molding process.

In various embodiments, the wafer 220W with the layer of the thermal interface material 330W may be arranged on a dicing tape 1000 and diced into individual chips 220 having the thermal interface material 330 arranged covering one of its main surfaces 220S.

The pick-and-place-process may be executed essentially as known in the art for arranging the chip 220 with the thermal interface material 330 facing away from the leadframe 224. This is indicated by the arrow linking the side process of FIG. 10S to FIG. 10C. The thermal interface material 330 may thus be pointing towards a mold 332 to be arranged. As described above in context with FIGS. 3A to 3F and FIGS. 4A to 4H, the mold 332 may be arranged to press down the thermal interface material 330.

In various embodiments, the thermal interface material 330 may extend all the way to the edge of the chip 330 and thereby differ from the embodiments using a stencil for arranging the thermal interface material 330 as the pre-defined pattern.

The embodiments having the thermal interface material 330 covering the full surface 330S of the chip 330 may have an advantage of having a larger thermal interface area than with the predefined pattern, thereby increasing the heat dissipation surface.

Furthermore, the full-surface embodiment may be more easily manufactured than the embodiment using the stencil method, since, as described above, the thermal interface material 330 may be simply applied using a squeegee or a film.

Additionally, the full-surface embodiment also avoids any thermal interface material spillage issue that may be associated with the stencil printing method. For example, thermal interface material 330 may be spilled onto the carrier or surrounding chips in carrier locations devoid of a chip due to chip 220 rejection earlier in the processing sequence.

Various embodiments may be used in packages 300 that do not need a lead extending out of the chip package 300. Such packages 300 may often be used for vertical devices, like for example silicon carbide transistors, e.g. SiC CMOS.

The thermal interface material 330 may in various embodiments form a layer with a thickness T of at least 20 μm, for example at least 50 μm, for example at least 100 μm, for example at least 150 μm, for example at least 200 μm (see FIG. 5D).

The thermal interface material 330 may be elastic in the sense that the material 330 may be compressible, and may, when it is released, be restored essentially to its original (i.e., pre-compression) shape. In various embodiments, the elastic thermal interface material may have a Young's modulus of less than about 10 GPa, for example less than 6 GPa, e.g. less than 4 GPa, e.g. less than 2 GPa, e.g. less than 1 GPa.

FIG. 9 shows a diagram 900 of compression versus Young's modulus for thermal interface materials 330 in accordance with various embodiments. Calculations are shown for two different thicknesses (50 μm and 80 μm) of the thermal interface material 330. The calculations are based on a pressure (a normal stress) of 8 MPa being exerted on the mold 332 and thereby on the thermal interface material 330. The diagram 900 is shown with the Young's modulus (referred to as material modulus in the diagram) on the X-axis, and a resulting strain (resulting difference in thickness) on the Y-axis. Even though calculations have been performed only up to a Young's modulus of 9 GPa, it may be extrapolated that a Young's modulus of less than about 10 GPa may be sufficiently elastic (compressible) for being used in various embodiments.

In various embodiments, it may be sufficient if the thermal interface material 330 is elastic, for example having the above cited Young's modulus, during an encapsulation process, for example while a mold 332 for defining a space for the packaging material 230 and the packaging material 230 (also referred to as encapsulation material or as molding material) are arranged. A processing temperature during the arranging of the mold 332 and of the packaging material 230 may for example be above 50° C., e.g. above 70° C., for example around 170° C., or for example between about 170° C. and 200° C.

Figure 3E:
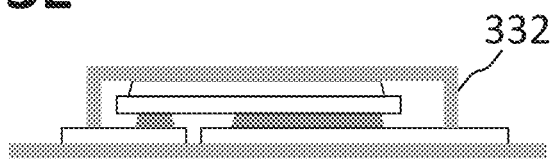
Figure 4A:
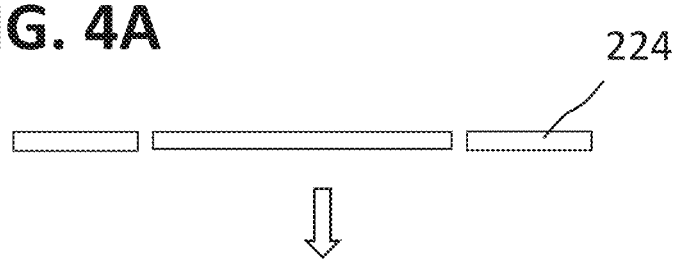
FIGS. 4A to 4H illustrate, as a sequence of schematic cross-sectional views, a method of forming a chip package according to various embodiments.
Figure 4B:
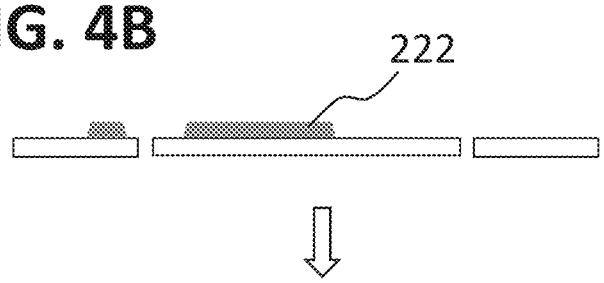
Figure 4C:
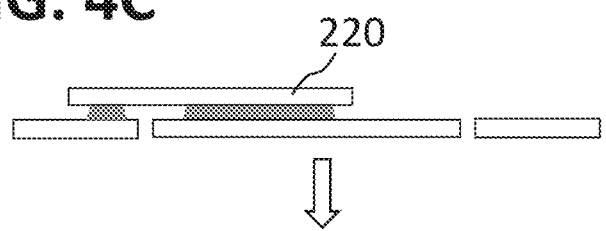
Figure 4D:
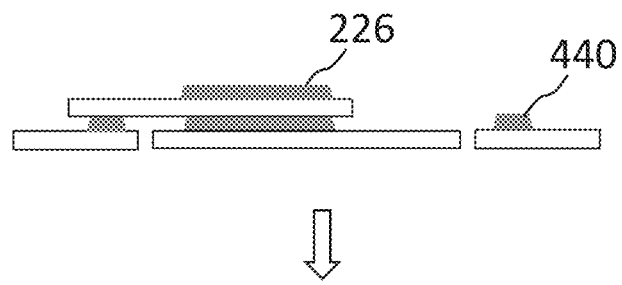
Figure 4E:
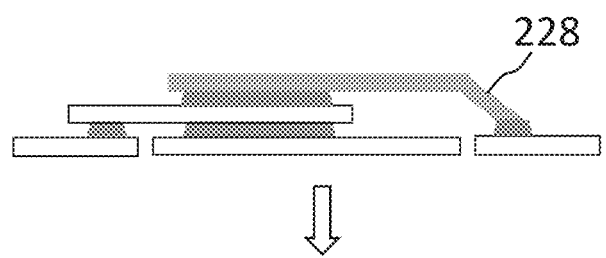
Figure 4F:
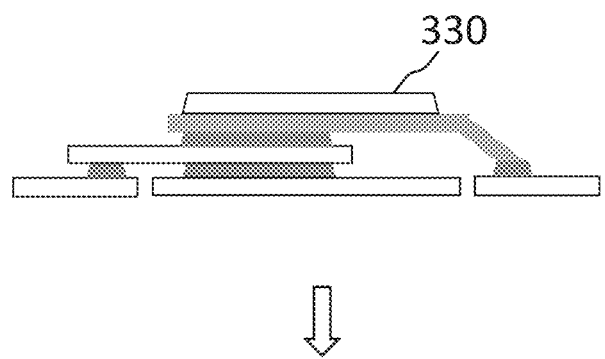
Figure 4G:
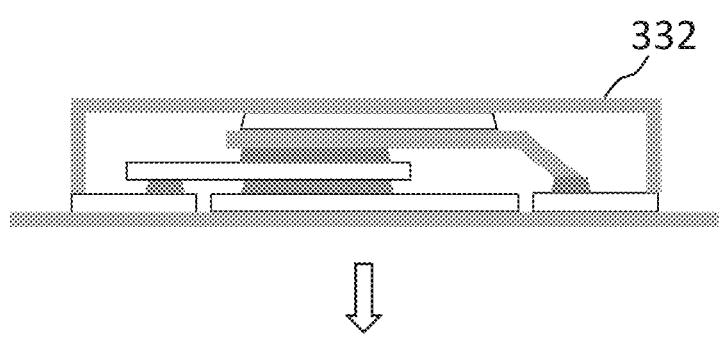

In various embodiments, the elasticity of the thermal interface material 330 may allow it to be compressed by the mold 332 when the mold 332 is arranged over the chip 220. This is shown in FIGS. 3E, 4G, and 10D, and in more detail in FIGS. 5A to 5D.

In other words, the mold 332 may be arranged around the thermal interface material 330 and at least partially around the semiconductor chip 220, thereby compressing the elastic thermal interface material 330 with the mold 332.

The elasticity of the thermal interface material 330 may be configured, e.g. by a selection of the material and/or by a processing temperature, to be in a range that protects the chip 220 from damage during the arranging of the mold 332, and also provides a sufficiently firm pressure contact between an inner surface of the mold 332 and the thermal interface material 330 to prevent the packaging material 230 from bleeding or being forced into a gap between the thermal interface material 330 and the mold 332. See also FIG. 9 for a suitable Young's modulus of the thermal interface material 330.

As described above, the thermal interface material 330 may in various embodiments have sufficient elasticity at the processing temperature, which may be elevated with respect to room temperature and/or an operating temperature of the chip package 300. At room temperature, the thermal interface material 330 may be considerably less elastic. For example, the thermal interface material 330 may, after cooling down, be hard enough to avoid getting scratched by routine handling. In other words, the thermal interface material 330 may have a Young's modulus that may be lower at mold temperature, and higher at room temperature and/or at operation temperature. For example, the Young's modulus may be lower than 10 GPa at the processing/molding temperature, and at least 10 GPa at room temperature/operation temperature. The Young's modulus may be a factor of two or more, e.g. a factor three, four, five, or ten, at room temperature as compared to the Young's modulus at processing/molding temperature. In various embodiments, the thermal interface material 330 may thus be compressible during processing, and essentially solid during operation (e.g., at room temperature).

A regular molding machine that is typically used in the art can be used for the molding process.

The elastic thermal interface material 330 may in various embodiments include or consists of a silicone material, or of a different polymer material like for example epoxy and/or acrylic. In various embodiments, the thermal interface material 330 may include or consist of a mixture of materials, for example of a mixture of epoxy and acrylic for tuning the elasticity to a desired value and/or temperature characteristic, or an elastic base material with a filler material (e.g., as small particles) for improving a thermal conductivity, or the like. In various embodiments, it may be necessary to cure the thermal interface material 330 after arranging it on the chip 220.

The thermal interface material 330 may be electrically insulating or electrically conductive, depending on the application.

In various embodiments, after the arranging of the mold 332, the thermal interface material 330 may be in its compressed configuration. FIG. 5B illustrates this by showing an original outline of the thermal interface material 330 as a dashed line, and the compressed configuration of the thermal interface material 330 as a solid line.

In this configuration, the mold 332 may in various embodiments be filled with the packaging material 230, thereby encapsulating the chip 220.

The packaging material 230 may be a packaging material as known in the art, for example a mold compound or the like, for example a thermoplastic polymer that may harden when it cools down. The molding process is illustrated in FIGS. 3E to 3F, FIGS. 4G to 4H, FIGS. 5B to 5C, and FIGS. 10D to 10E.

Figure 3F:
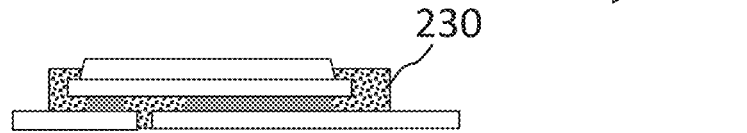
Figure 4H:
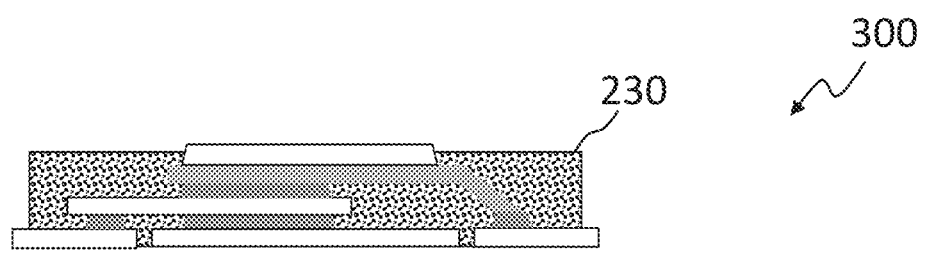

The method may in various embodiments further include removing the mold 332, thereby re-expanding the elastic thermal interface material 330. This is illustrated in FIGS. 3F, 4H, 10E, and in particular in FIG. 5D.

The re-expanded elastic thermal interface material 330 may, after the removal of the mold 332, project above a surface level 230S of the packaging material. 230. A height difference d between the re-expanded elastic thermal interface material 330 and the surface 230S of the packaging material 230 may in various embodiments be at least 20 µm, for example at least 50 µm, for example at least 75 µm, for example at least 100 µm (see FIG. 5D).

In various embodiments, a compressed thickness cT (see FIG. 5B) may be adjusted to be at least about 20 µm. A minimum value for the compressed thickness cT may depend on the packaging material 230, for example on its viscosity at molding temperature. The minimum value for the compressed thickness cT may be selected to allow the packaging material 230 to flow into the gap (of thickness cT and depth depending on a size difference between the thermal interface material 330 and the chip 220) formed between the mold 332 and a top surface 220S of the chip 220 (or—not shown—of the clip 228) during the molding process. the minimum value of 20 µm may be suitable for packaging materials as commonly used in the art. However, a more viscous packaging material 230 may require a higher value for the compressed thickness cT, e.g. 30 µm or 50 µm, whereas a more liquid packaging material 230 may allow for a smaller gap, e.g. with a minimum thickness of, for example, 10 µm or 15 µm.

The thermal interface material 330 may, after the removal of the mold 332, be exposed at a surface of the chip package 300.

In various embodiments, the re-expansion of the released thermal interface material 330 may create a gap 550 between the elastic thermal interface material 330 and the packaging material 230. In other words, the pressure exerted by the mold 332 on the thermal interface material 330 may have pressed the thermal interface material 330 into a broader compressed configuration. The packaging material 230 may have formed (and hardened) around that broader configuration and may (after hardening) be unable to fill the gap 550 that forms when the released thermal interface material 330 returns to its narrower uncompressed configuration.

Even though FIGS. 3A to 3F, 4A to 4H, 10A to 10E, and 5A to 5D illustrate the processes in a defined order, at least some of the processes may be executed in a different order as required.

For example, the thermal interface material 330 may be applied to the chip 220 before the arranging of the chip 220 on the carrier 224, for example at a wafer level before a dicing of the wafer into individual chips 220. This is illustrated for a full wafer backside coating in FIGS. 10A to 10E, but the partial application of the thermal interface material 330, e.g. via printing or using a structured mask, may in various embodiments also be performed at the wafer level. Similarly, the adhesion materials 222 and/or 226 may be pre-applied, for example at a wafer level.

Figure 1:
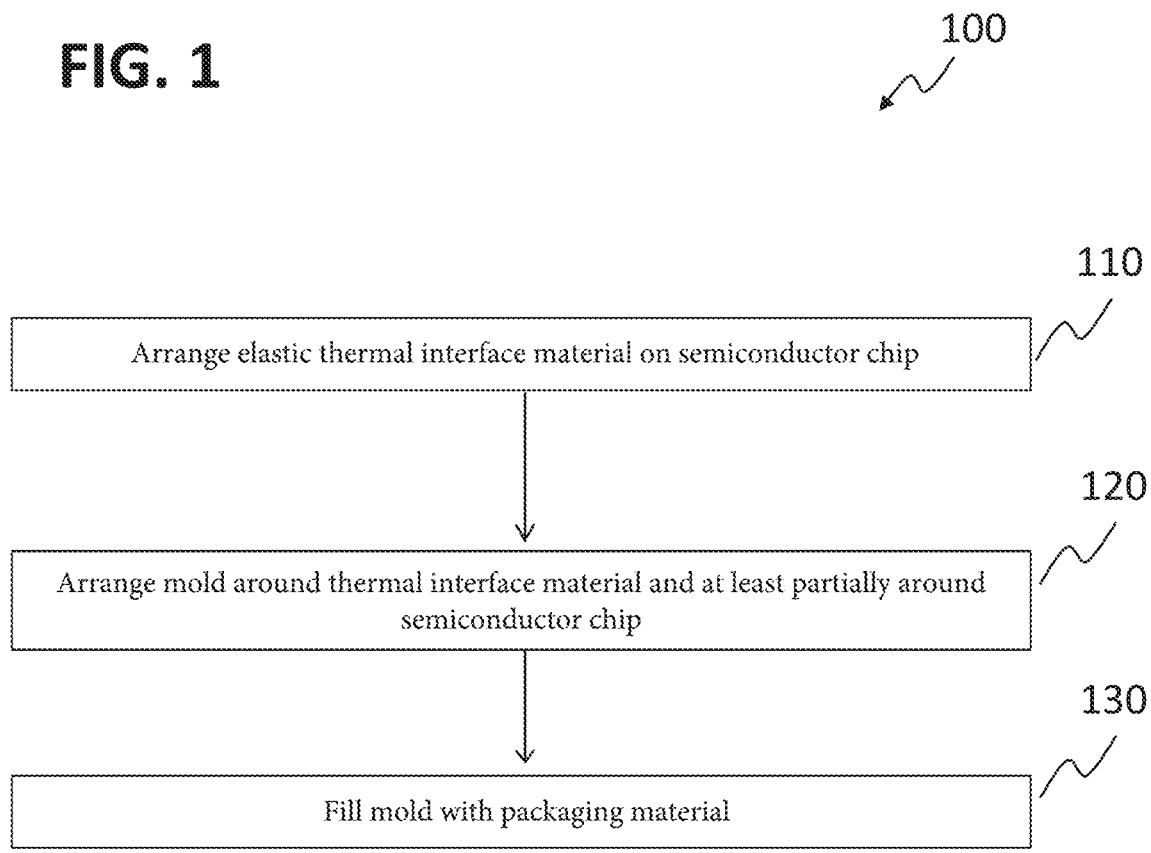
FIG. 1 shows a flow diagram of a method of forming a chip package in accordance with various embodiments.
Figure 2:
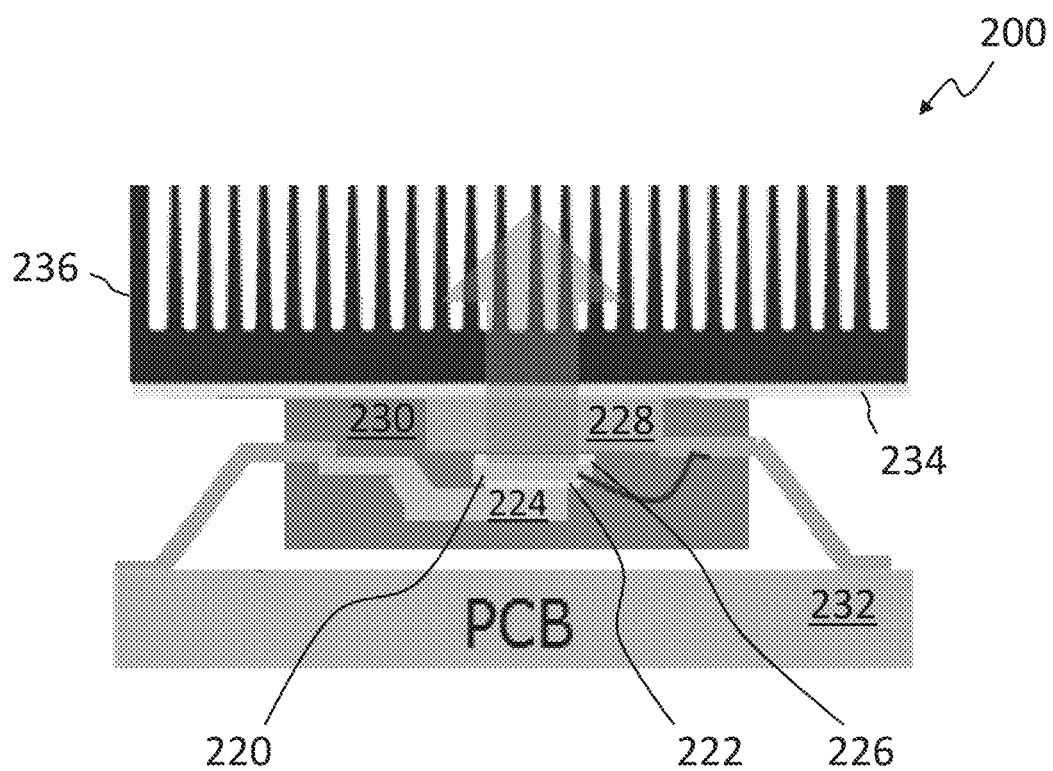
FIG. 2 shows a schematic cross-sectional view of a semiconductor arrangement according to prior art.

FIG. 1 shows a flow diagram 100 of a method of forming a chip package in accordance with various embodiments.

The method may include arranging an elastic thermal interface material on a semiconductor chip (at 110), arranging a mold around the thermal interface material and at least partially around the semiconductor chip, thereby compressing the elastic thermal interface material with the mold (at 120), and filling the mold with a packaging material (at 130).

Each of FIGS. 7A and 7B shows a schematic cross-sectional view of a semiconductor arrangement 700 in accordance with various embodiments.

In various embodiments, the semiconductor arrangement may include a chip package 300 as described above, and a cooling structure 772.

The cooling structure 772 may be configured as a cooling structure as known in the art, for example, include or consist of a material, e.g. metal, with a high thermal conductivity, and may for example be structured with fins, channels or the like to increase a surface exposed to a cooling medium, e.g. air.

In various embodiments, the cooling structure may be mounted on the thermal interface material 330.

A further thermal interface material 770 may in various embodiments be used for mounting the cooling structure 772 to the chip package 300. In other words, the cooling structure 772 may be indirectly mounted to the thermal interface material 330. The further thermal interface material 770 may for example be or include an adhesive with high thermal conductivity. See FIG. 7A for an exemplary embodiment.

The mounting of the cooling structure 772 may in various embodiments be performed by the customer.

In various embodiments, the cooling structure 772 may be directly mounted to the thermal interface material 330. An adhesive material may in that case be formed (e.g. only) between the packaging material 230 and the cooling structure 772. A connection between the packaging material 230 and the cooling structure 772 may be sufficiently strong for the cooling structure 772 to exert a small amount of pressure on the thermal interface material 330. Thereby, a conformity between the cooling structure 772 and the thermal interface material 330 may be improved (see FIG. 7B).

In various embodiments, the cooling structure 772 may be provided with a protrusion 772P at its bottom side. The protrusion 772P may be configured to project into the gap 550. Thereby, a mechanical robustness, for example towards a lateral relative motion of the cooling structure 772 and the chip package 300, may be increased. See FIG. 7B for a respective exemplary embodiment.

FIG. 8 shows a flow diagram 800 of a method of forming a semiconductor arrangement.

The method may include arranging an elastic thermal interface material on a semiconductor chip (at 810), arranging a mold around the thermal interface material and at least partially around the semiconductor chip, thereby compressing the elastic thermal interface material with the mold (at 820), filling the mold with a packaging material (at 830), and attaching a cooling structure to the elastic thermal interface material (at 840).

In other words, the method may include forming a chip package in accordance with various embodiments, and attaching a cooling structure to the elastic thermal interface material.

Various examples will be illustrated in the following:

Example 1 is a method of forming a chip package. The method may include arranging an elastic thermal interface material over a semiconductor chip, wherein the elastic thermal interface material may be configured to transfer heat from the chip to an outside, arranging a mold around the thermal interface material and at least partially around the semiconductor chip, thereby compressing the elastic thermal interface material with the mold, and filling the mold with a packaging material.

In Example 2, the subject matter of Example 1 may optionally further include removing the mold, thereby re-expanding the elastic thermal interface material.

In Example 3, the subject matter of Example 2 may optionally further include that the re-expanded elastic thermal interface material projects above a surface level of the packaging material.

In Example 4, the subject matter of Example 3 may optionally further include that a height difference between the re-expanded elastic thermal interface material and the surface of the packaging material is at least 20 µm.

In Example 5, the subject matter of any of Examples 1 to 4 may optionally further include that the thermal interface material forms a layer with a thickness of at least 20 µm.

In Example 6, the subject matter of any of Examples 1 to 5 may optionally further include that the elastic thermal interface material is arranged in direct physical contact with the chip.

In Example 7, the subject matter of any of Examples 1 to 5 may optionally further include mounting a clip on the chip, wherein the elastic thermal interface material is arranged in direct physical contact with the clip.

In Example 8, the subject matter of any of Examples 1 to 7 may optionally further include that the elastic thermal interface material has a Young's modulus of less than 10 GPa at least at a molding temperature of the packaging material.

In Example 9, the subject matter of any of Examples 1 to 8 may optionally further include that a processing temperature during the arranging of the mold is above 50° C.

In Example 10, the subject matter of any of Examples 1 to 9 may optionally further include that the arranging of the elastic thermal interface material includes defining a pattern of the elastic thermal interface material by printing, for example stencil printing.

In Example 11, the subject matter of any of Examples 1 to 10 may optionally further include curing the elastic thermal interface material before the arranging of the mold.

In Example 12, the subject matter of any of Examples 1 to 11 may optionally further include that the elastic thermal interface material includes or consists of a silicone material, epoxy and/or acrylic.

Example 13 is a method of forming a semiconductor arrangement. The method may include forming a chip package in accordance with the method of any of Examples 1 to 12, and attaching a cooling structure to the elastic thermal interface material.

In Example 14, the subject matter of Example 13 may optionally further include that the cooling structure is attached in such a way that it extends into a gap between the elastic thermal interface material and the packaging material.

Example 15 is a chip package. The chip package may include a semiconductor chip, an elastic thermal interface material over the semiconductor chip, wherein the elastic thermal interface material is configured to transfer heat from the chip to an outside, and a packaging material around the thermal interface material and at least partially around the semiconductor chip, wherein the elastic thermal interface extends above a surface level of the packaging material.

In Example 16, the subject matter of Example 15 may optionally further include a gap between the elastic thermal interface material and the packaging material.

In Example 17, the subject matter of Example 14 or 15 may optionally further include that a height difference between the elastic thermal interface material and the surface of the packaging material is at least 20 µm.

In Example 18, the subject matter of any of Examples 14 to 17 may optionally further include that the thermal interface material forms a layer with a thickness of at least 20 µm.

In Example 19, the subject matter of any of Examples 14 to 18 may optionally further include that the elastic thermal interface material is arranged in direct physical contact with the chip.

In Example 20, the subject matter of any of Examples 14 to 18 may optionally further include a clip mounted on the chip, wherein the elastic thermal interface material is arranged in direct physical contact with the clip.

In Example 21, the subject matter of any of Examples 14 to 20 may optionally further include that the elastic thermal interface material has a Young's modulus of less than 10 GPa at least at a molding temperature of the packaging material.

In Example 22, the subject matter of any of Examples 14 to 21 may optionally further include that a processing temperature during the arranging of the mold is above 50° C.

In Example 23, the subject matter of any of Examples 14 to 22 may optionally further include that the elastic thermal interface material is a printed material, for example a stencil printed material.

In Example 24, the subject matter of any of Examples 14 to 23 may optionally further include that the elastic thermal interface material is a cured material.

In Example 25, the subject matter of any of Examples 14 to 24 may optionally further include that the elastic thermal interface material comprises or consists of a silicone material, epoxy and/or acrylic.

Example 26 is a semiconductor arrangement. The semiconductor arrangement may include a package in accordance with any of the Examples 14 to 25 and a cooling structure attached to the elastic thermal interface material.

In Example 27, the subject matter of Example 26 may optionally further include that the cooling structure extends into a gap formed between the elastic thermal interface material and the packaging material.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip package, comprising:
   a semiconductor chip;
   an elastic thermal interface material over the semiconductor chip, wherein the elastic thermal interface material is configured to transfer heat from the semiconductor chip to an outside;
   a packaging material around the elastic thermal interface material and at least partially around the semiconductor chip; and
   a gap between the elastic thermal interface material and the packaging material that is arranged directly above and extends along an upper surface of the semiconductor chip,
   wherein the elastic thermal interface material extends above a surface level of the packaging material.

2. The chip package of claim 1, wherein a height difference between the elastic thermal interface material and the surface of the packaging material is at least 20 µm.

3. The chip package of claim 1, wherein the elastic thermal interface material forms a layer with a thickness of at least 20 µm.

4. The chip package of claim 1, wherein the elastic thermal interface material is arranged in direct physical contact with the semiconductor chip.

5. The chip package of claim 1, further comprising:
   a clip mounted on the semiconductor chip,
   wherein the elastic thermal interface material is arranged in direct physical contact with the clip.

6. The chip package of claim 1, wherein the elastic thermal interface material has a Young's modulus of less than 10 GPa at least at a molding temperature of the packaging material.

7. The chip package of claim 1, wherein the elastic thermal interface material comprises a silicone material, epoxy and/or acrylic.

8. A semiconductor arrangement, comprising:
   the chip package of claim 1; and
   a cooling structure attached to the elastic thermal interface material.

9. The semiconductor arrangement of claim 8, wherein the cooling structure is configured to extend into the gap of the chip package.

* * * * *